United States Patent
McQuilkin

(12) 
(10) Patent No.: US 6,414,496 B1
(45) Date of Patent: Jul. 2, 2002

(54) COMPARATOR STRUCTURES AND METHODS FOR AUTOMATIC TEST EQUIPMENT

(75) Inventor: Christopher McQuilkin, Salem, NH (US)

(73) Assignee: Analog Devices, Inc., Norwood, MA (US)

( * ) Notice: Subject to any disclaimer, the term of this patent is extended or adjusted under 35 U.S.C. 154(b) by 21 days.

(21) Appl. No.: 09/595,451

(22) Filed: Jun. 16, 2000

(51) Int. Cl.⁷ .............................................. G01R 27/02
(52) U.S. Cl. ...................................................... 324/606
(58) Field of Search .............................. 324/606, 612, 324/615, 620, 622, 623; 330/149, 151, 296; 375/296, 297, 345; 455/63, 115, 126, 295, 296

(56) References Cited

U.S. PATENT DOCUMENTS

| | | | |
|---|---|---|---|
| 4,879,519 A | * 11/1989 | Meyer ......................... | 330/149 |
| 4,987,378 A | * 1/1991 | Eggleston et al. .......... | 330/149 |
| 5,216,373 A | 6/1993 | Wakamatsu et al. ........ | 324/720 |
| 5,337,014 A | * 8/1994 | Najle et al. .................. | 324/613 |
| 5,532,590 A | 7/1996 | Yamanaka ................... | 324/239 |
| 5,940,441 A | 8/1999 | Cranford ..................... | 375/232 |
| 5,955,890 A | 9/1999 | Gillette ......................... | 326/30 |
| 6,016,566 A | 1/2000 | Yoshida ....................... | 714/736 |

* cited by examiner

*Primary Examiner*—N. Le
*Assistant Examiner*—Etienne P LeRoux
(74) *Attorney, Agent, or Firm*—Koppel, Jacobs, Patrick & Heybl

(57) ABSTRACT

Comparator methods and structures are provided whose accuracy in analyzing an output signal $S_{out}$ of a DUT is enhanced because they compensate for a signal distortion that is imposed by a transmission path over which the output signal $S_{out}$ is received. The methods include the steps of a) providing a reference signal $S_{ref}$; b) combining the reference signal $S_{ref}$ with a reference distortion that corresponds to the signal distortion to thereby realize a compensated reference signal $S_{cmp-ref}$; and c) comparing the output signal $S_{out}$ to the compensated reference signal $S_{cmp-ref}$ to determine signal parameters of the output signal $S_{out}$. The methods of the invention facilitate the use of simple comparator structures that do not significantly increase the cost of automatic test equipment but which do significantly increase accuracy of signal analysis.

16 Claims, 5 Drawing Sheets

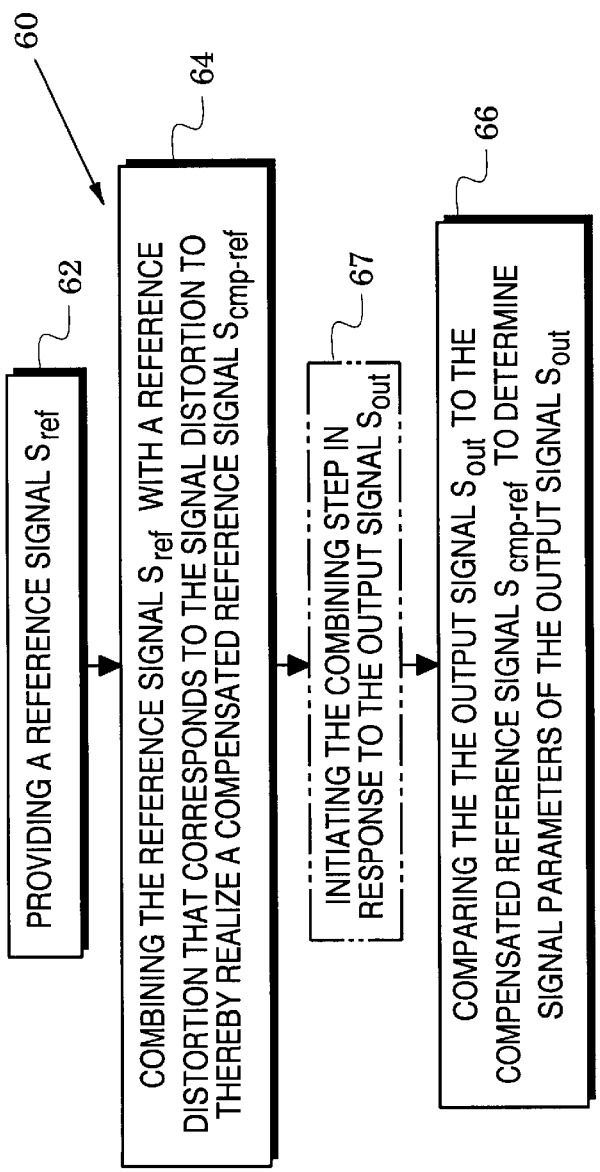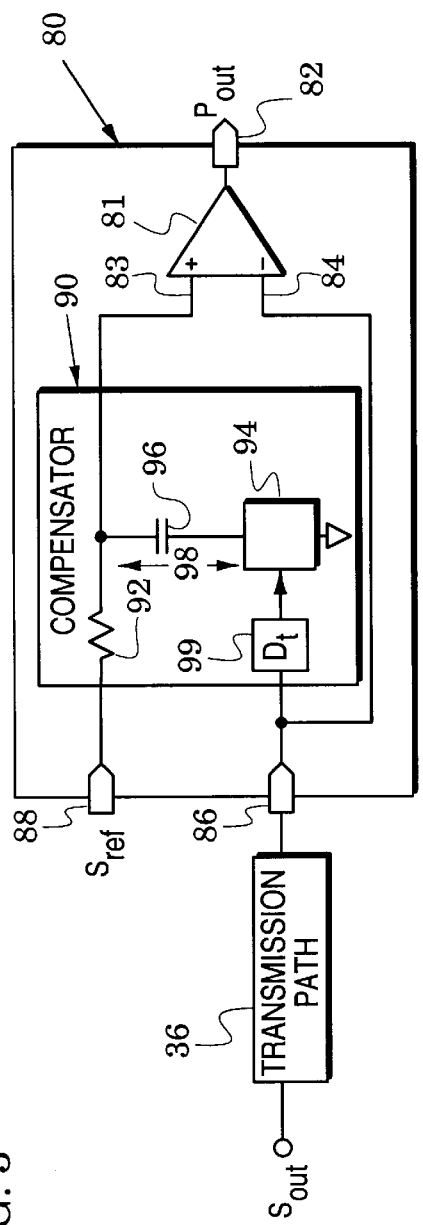
FIG. 3
FIG. 4

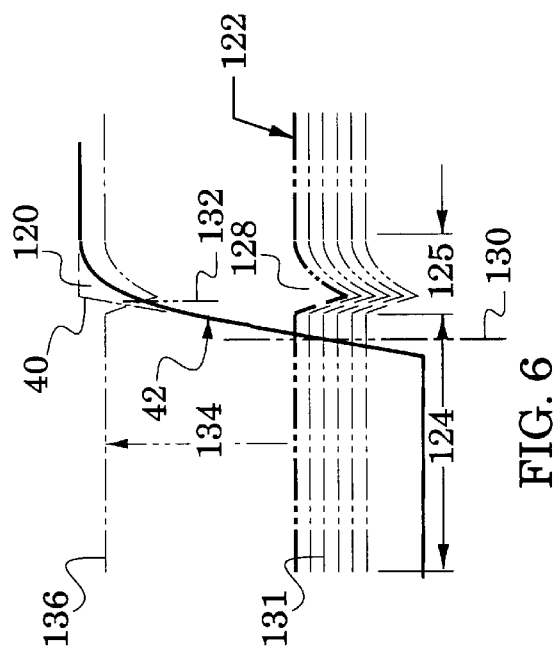
FIG. 6
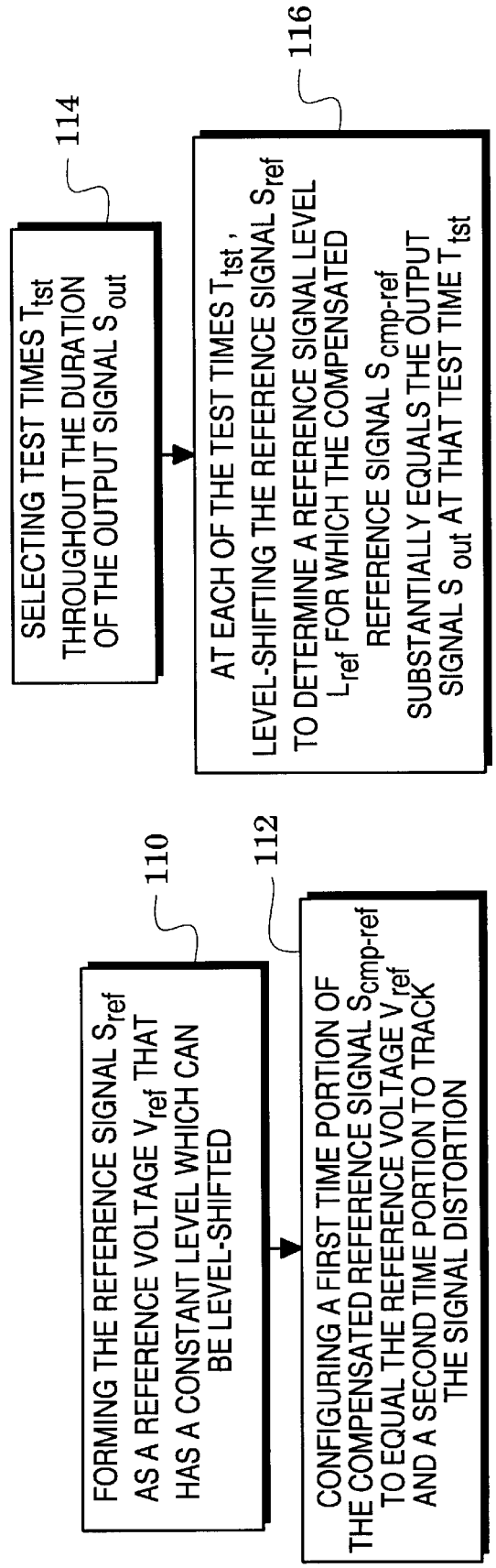
FIG. 5B
FIG. 5A

US 6,414,496 B1

COMPARATOR STRUCTURES AND METHODS FOR AUTOMATIC TEST EQUIPMENT

BACKGROUND OF THE INVENTION

1. Field of the Invention

The present invention relates generally to automatic test equipment (ATE) and, more particularly, to measurement errors in ATEs.

2. Description of the Related Art

Exemplary automatic test equipments (ATEs) are typically configured to quickly test the responses of a large number of electronic modules which are conventionally referred to as devices under test (DUTs). In general, each DUT has been designed to receive input stimulation signals $S_{in}$ at a first set of DUT terminals and, in response, generate output signals $S_{out}$ at a second set of terminals. Accordingly, an exemplary ATE generates the input signals, applies them to the first terminal set of each DUT and receives and analyzes the output signals $S_{out}$ from the second terminal set of each DUT to determine which DUTs meet their specified performance. Because this performance must generally be met while supplying or sinking a specified current, the exemplary ATE also applies a specified current load to the DUT.

ATEs typically include a large number of test interface modules that are each coupled to a terminal of a respective one of the DUTs. Each test interface module generally incudes circuits that a) generate input driving signals for its respective DUT, b) compare the DUT's output signals to reference signals and c) apply specified current loads to the DUT. Because these test interface circuits realize driving, comparing and loading functions, they are typically called DCL modules (D, C and L respectively referring to the driving, comparing and loading functions). In addition, the driver circuits are often referred to as "pin drivers" because they apply input signals to DUT terminals or pins.

The output signals $S_{out}$ are carried along transmission channels or paths from the DUTs to the ATE comparators that characterize or analyze them by comparing them to reference signals $S_{ref}$. Unfortunately, all transmission paths have transmission parameters (e.g., skin effect and dielectric absorption) that induce signal distortion so that output signals $S_{out}$ enter the transmission paths but distorted output signals $S_{dstrd-out}$ exit the paths. The reference signals $S_{ref}$ are therefore compared to distorted output signals $S_{dstrd-out}$ rather than to the original output signals $S_{out}$. Therefore, the ATEs performance measurement is in error because it is incorrectly based upon the distorted output signals $S_{dstrd-out}$.

For example, FIG. 1 shows a DUT 20 and a plurality of test interface modules 22A, 22B–22N that are each coupled to a respective one of of the DUT's terminals 24. The test interface module 22A is detailed to show that it includes a driver in the form of a waveform synthesizer 26, a comparator 28 and an active load 30. In response to control signals $S_{cntrl}$ 32, the synthesizer and the active load can apply specified input driving signals and current loads to the terminal 32 of the DUT 20. The other test interface modules can provide similar measurement functions to their respective DUT terminals.

The DUT 20 generates an output signal $S_{out}$ at the terminal 34 and it is carried over a transmission path 36 to the comparator 28 which compares this signal to a reference signal $S_{ref}$ and delivers a resultant output at an output port $P_{out}$. Although the transmission path 36 is indicated as a coaxial cable, it can take on other transmission path forms, (e.g., wires, striplines and microstrips). Regardless of its exact form, the transmission path 34 will impose a signal distortion upon the output signal $S_{out}$. A distorted signal is thus presented to the comparator 28 and, accordingly, its output at the output port $P_{out}$ characterizes this distorted signal rather than the output signal $S_{out}$.

FIG. 2A shows an exemplary output signal $S_{out}$ 40 that is provided to the comparator 28 over a transmission path 36 that imposes a signal distortion so that a distorted output signal $S_{dst-out}$ 42 is received by the comparator 28. With the aid of a level-shifted reference signal $S_{ref}$, the comparator 28 can detect amplitudes of the distorted output signal at respective test times $T_{tst}$ throughout the signal's duration.

For example, at an exemplary test time 44 of FIG. 2A, a latch signal can be applied to the comparator 28 to thereby latch its output at the output port $P_{out}$. By observing the latched output for each of a plurality of level-shifted reference signals $S_{ref}$, a reference signal level 46 can be found wherein above this signal level, the comparator's output has one polarity and below it, the comparator's output has an opposite polarity. Thus, the distorted output signal 42 has an amplitude substantially equal to the reference signal level 46 at the exemplary test time 44. This process can be automated with various conventional circuits. An integrator 48, for example, will automatically servo the reference signal to the final reference value 46.

FIG. 2B repeats the distorted output signal 42 and shows a table 50 of corresponding time and voltage pairs wherein each voltage $V_{tst}$ is the amplitude of the distorted output signal at a test time that is determined by a respective latch delay $D_{latch}$. In this exemplary process (sometimes referred to as "digitizing" or, in ATE vernacular, "schmooing"), the comparator 28 of FIGS. 1 and 2A can determine time and voltage pairs that define the shape and timing of a signal at its input. Because this signal is, however, the distorted output signal 42 of FIG. 2A, the table 50 of FIG. 2B includes measurement errors generated by the signal distortion of the transmission path 36.

Numerous efforts (e.g., see U.S. Pat. No. 5,216,373, 5,532,590, 5,940,441, 5,955,890 and 6,016,566) have been directed to the correction and/or compensation of ATE measurement errors that originate because of transmission-path signal distortion. Although these efforts may reduce the distortion-induced errors, they are generally complex solutions that would impose unacceptable cost increases in ATEs that are configured to simultaneously test large numbers (e.g., hundreds) of DUTs.

SUMMARY OF THE INVENTION

The present invention is directed to comparator methods and structures whose accuracy in analyzing an output signal $S_{out}$ of a DUT is enhanced because they compensate for a signal distortion that is imposed by a transmission path over which the output signal $S_{out}$ is received.

These goals are realized with an analysis method that comprises the process steps of:

a) providing a reference signal $S_{ref}$, b) combining the reference signal $S_{ref}$ with a reference distortion that corresponds to the signal distortion to thereby realize a compensated reference signal $S_{cmp-ref}$, and c) comparing the output signal $S_{out}$ to the compensated reference signal $S_{cmp-ref}$ to determine signal parameters of the output signal $S_{out}$.

In a method embodiment, the providing step includes the step of configuring the reference signal $S_{ref}$ as a constant reference voltage $V_{ref}$ that can be level-shifted and the combining step includes the step of configuring a first time portion of the compensated reference signal $S_{cmp-ref}$ to substantially equal the reference voltage $V_{ref}$ and a second time portion of the compensated reference signal $S_{cmp-ref}$ to substantially track the signal distortion.

In another method embodiment, the comparing step includes the step of level-shifting the reference signal $S_{ref}$, at each of test times $T_{tst}$, to determine a reference signal level $L_{ref}$ for which the compensated reference signal $S_{cmp-ref}$ substantially equals the output signal $S_{out}$ at that test time $T_{tst}$.

The methods of the invention facilitate the use of simple comparator structures that do not significantly increase the cost of ATEs but which do significantly increase accuracy of signal analysis.

The novel features of the invention are set forth with particularity in the appended claims. The invention will be best understood from the following description when read in conjunction with the accompanying drawings.

BRIEF DESCRIPTION OF THE DRAWINGS

FIG. 3 is a flow chart that illustrates method embodiments of the inventions for analyzing an output signal $S_{out}$ of a DUT while compensating for a signal distortion that is imposed by a transmission path over which the output signal $S_{out}$ is received;

FIG. 4 is a schematic of a comparator system of the present invention that can be used to realize the process steps of FIG. 3;

FIGS. 5A and 5B describe additional process steps that relate to the flow charts of FIG. 3;

FIG. 6 is a timing diagram that illustrates the process steps of FIGS. 5A and 5B as they relate to the comparator system of FIG. 4;

DETAILED DESCRIPTION OF THE PREFERRED EMBODIMENTS

FIG. 3 is a flow chart 60 that illustrates a method embodiment of the present invention for analyzing an output signal $S_{out}$ of a DUT while compensating for a signal distortion that is imposed by a transmission path over which the output signal $S_{out}$ is received.

In particular, the method has a first process step 62 that provides a reference signal $S_{ref}$. In a second process step 64, the provided reference signal $S_{ref}$ is combined with a reference distortion that corresponds to the signal distortion (that was imposed by the transmission path) to thereby realize a compensated reference signal $S_{cmp-ref}$. The output signal $S_{out}$ is then compared in process step 66 to the compensated reference signal $S_{cmp-ref}$ to thereby determine signal parameters of the output signal $S_{out}$. Preferably, methods of the invention also include process step 67 in which the combining step 64 of is initiated in response to the output signal $S_{out}$.

Because the reference distortion corresponds to the signal distortion and is included in the compensated reference signal $S_{cmp-ref}$, the comparison of step 66 is significantly more accurate than the prior art in measuring differences between the output signal $S_{out}$ and the reference signal $S_{ref}$.

Figure 2A:
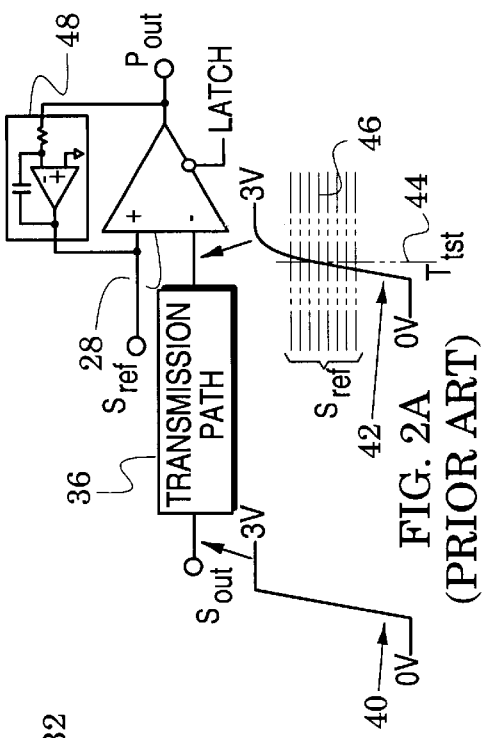
FIG. 2A is a schematic of a transmission path and a comparator in the test interface circuit of FIG. 1, the figure illustrates a signal distortion that is imposed on the output signal $S_{out}$ of the DUT of FIG. 1 by the transmission path.
Figure 2B:
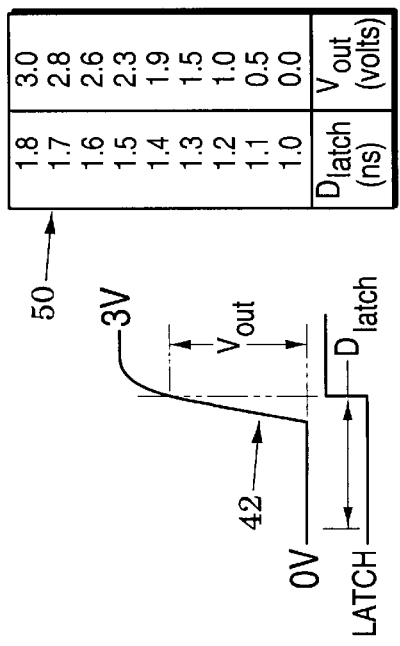
FIG. 2B shows a diagram and a table wherein the diagram illustrates the use of a latch in the comparator of FIG. 2A for obtaining time and voltage pairs of the output signal $S_{out}$ after it has been distorted by the transmission path of FIG. 2A and the table shows the resultant pairs.

The processes of FIG. 3 can be best understood with reference to a comparator system of the present invention that can be used to practice them. Accordingly, FIG. 4 shows a comparator system 80 which includes a comparator 81 that generates an output at an output port $P_{out}$ 82 in response to a difference between signals at first and second comparator input ports 83 and 84. An output signal $S_{out}$ of a DUT is received through the transmission path 36 (introduced in FIGS. 1 and 2A) so that it then passes to a system port 86 and is coupled to a compensator 90 and to the second input port 84. A reference signal $S_{ref}$ is received at a second system port 88.

The compensator 90 is configured to perform the process step 64 of FIG. 3. That is, it combines the reference signal $S_{ref}$ with a reference distortion that corresponds to the signal distortion that is imposed by the transmission path 36 that receives the output signal $S_{out}$ of the DUT. It thus generates and provides a compensated reference signal $S_{cmp-ref}$ to the first input port 83.

An exemplary compensator of the invention inserts an impedance in the form of a resistor 92 between the system port 88 and the first input port 83 of the comparator 81. It also includes a programmable current generator 94 which is coupled to the first input port 83 by a charge-storage device in the form of a signal-distortion capacitor 96. The programmable current generator 94 is responsive to the DUT's output signal $S_{out}$ at the system port 88.

In operation, the current source 94 inserts currents 98 through the capacitor 96 to charge it to voltages which apply a reference distortion to the reference signal $S_{ref}$ in accordance with process step 64 of FIG. 3. These currents are initiated in response to the received output signal $S_{out}$ in accordance with step 67 of FIG. 3. A compensated reference signal $S_{cmp-ref}$ is therefore provided to the first input port 83 where it is compared to the output signal $S_{ref}$ as it is received at the system port 86. In other embodiments of the invention, the response of the current generator 94 to the output signal $S_{out}$ can be adjusted in time by passing the output signal $S_{out}$ through a signal time delay $D_t$ 99.

The method 60 of FIG. 3 can be modified to form other method embodiments of the invention. For example, FIG. 5A adds a process step 110 in which the reference signal $S_{ref}$ is formed as a reference voltage $V_{ref}$ which can be level-shifted. A second process step 112 configures a first time portion of the compensated reference signal $S_{cmp-ref}$ to equal the reference voltage $V_{ref}$ and a second time portion to track the signal distortion. FIG. 5B adds a process step 114 that selects a plurality of test times $T_{tst}$ throughout the duration of the output signal $S_{out}$. At each of the test times $T_{tst}$, the reference signal $S_{ref}$ is then level shifted in process step 116 to determine a reference signal level $L_{ref}$ for which the compensated reference signal $S_{cmp-ref}$ substantially equals the output signal $S_{out}$ at that test time $T_{tst}$.

FIG. 6 is a signal diagram that illustrates the process steps of FIGS. 5A and 5B as practiced, for example, with the comparator system 80 of FIG. 4. The diagram shows an enlarged version of the distorted output signal $S_{dst-out}$ 42 of FIG. 2A. It also shows a portion of the output signal $S_{out}$ 40 of FIG. 2A and indicates a signal distortion area 120 between these signals.

In addition, the diagram shows a compensated reference signal $S_{cmp-ref}$ 122 in which a first time portion 124 substantially equals the reference voltage $V_{ref}$ (applied at system port 88 in FIG. 4) and a second time portion 125 substantially tracks the signal distortion 120 as specified in process step 112 of FIG. 5A. For example, the reduction of the compensated reference signal $S_{cmp-ref}$ at any selected time in a reference distortion area 128 is scaled so as to substantially equal the reduction (i.e., distortion) of the output signal $S_{out}$ 40 in the signal distortion area 120.

At a first test time 130, the reference signal is then level shifted to find a particular level 131 at which the compensated reference signal $S_{cmp-ref}$ 122 and the distorted output signal 42 are substantially equal as specified in process step 116 of FIG. 5B. This is determined by monitoring the output of the comparator 81 of FIG. 4. Because the first test time 130 is within the first time portion 124, this equality occurs when the reference voltage $V_{ref}$ equals the distorted output signal 42.

At a second test time 132, the reference voltage $V_{ref}$ is further level shifted (as indicated by shift arrow 134 to find a level 136 at which the compensated reference signal 122 and the distorted output signal 42 are substantially equal. Because the second test time 134 is within the second time portion 125, this equality occurs when the level shifted voltage $V_{ref}$ is above the distorted output signal 42. In particular, it is above the distorted output signal 42 by an amount which causes it to track the original output signal $S_{out}$ 40. These examples show that the comparator signal at the output port 82 of FIG. 4 accurately represents the differences between the reference signal $S_{ref}$ at the system port 88 and the output signal $S_{out}$ that enters the transmission path 36.

Figure 7:
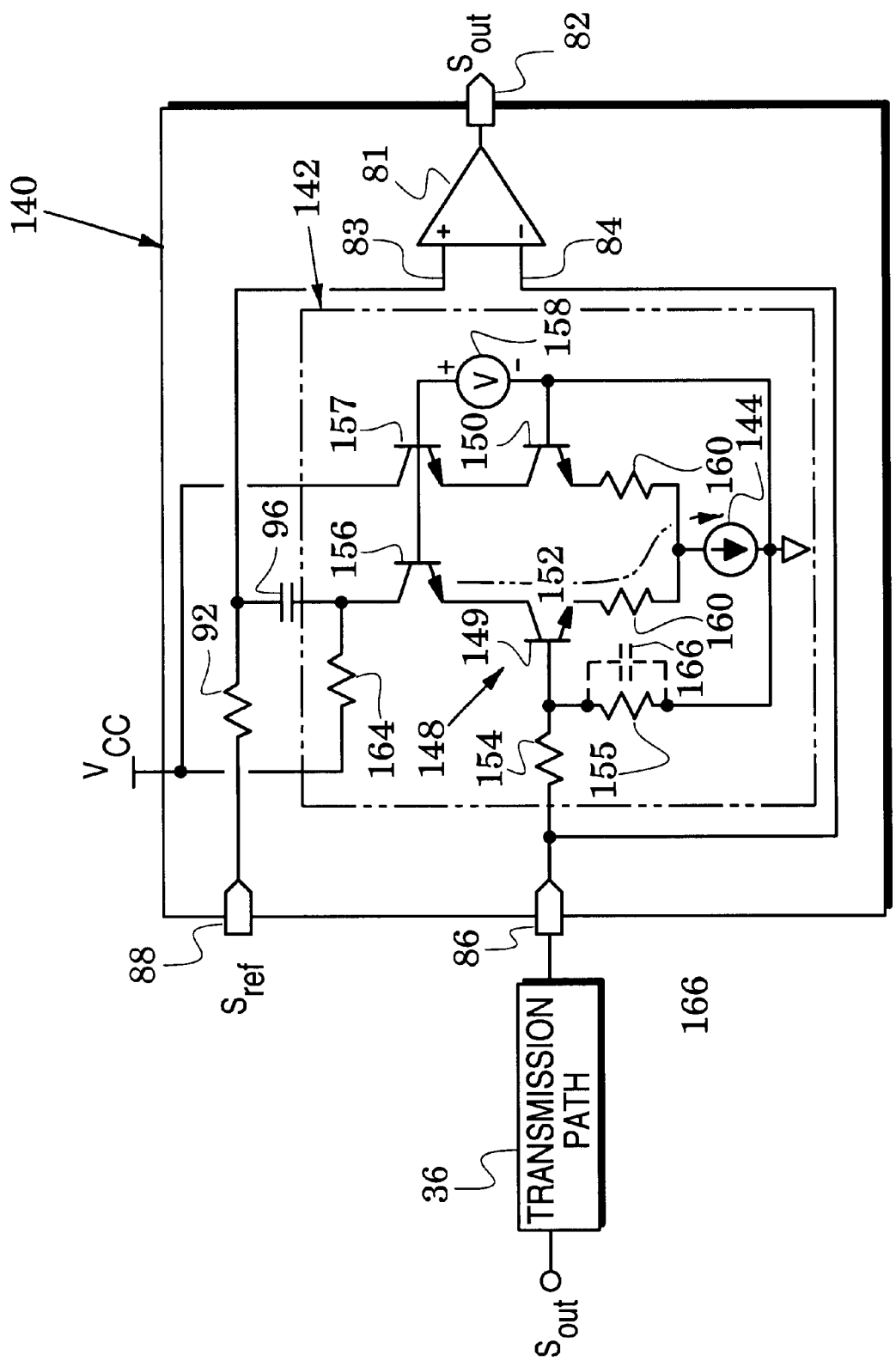
FIG. 7 is a schematic of another a comparator system embodiment of the present invention.

FIG. 7 is a schematic of another comparator system 140 of the present invention. Some portions of the system 140 are similar to the system 80 of FIG. 4 and accordingly like elements are indicated by like reference numbers. In FIG. 7, the current generator 94 of FIG. 4 is realized as a current generator 142 that has a current source 144 coupled to a differential pair 148 of transistors 149 and 150 that steer a portion 152 of the current of the current source 144 to the capacitor 96 in response to the output signal $S_{out}$.

Transistor 150 is biased to ground and the output signal $S_{out}$ is preferably attenuated by a voltage divider in the form of resistors 154 and 155 before it is applied to the transistor 149. In addition, a pair of cascade-arranged transistors 156 and 157 are biased by a voltage source 158 and are arranged to buffer the outputs of the differential pair 148 so as to improve operational performance of the transistors of this pair (e.g., to reduce their Miller capacitance). The current source 144 is coupled to the differential pair 148 by degeneration resistors 160 that enhance the linearity of the differential pair. The output of transistor 157 is directly coupled to a supply voltage $V_{CC}$ while the output of transistor 156 is coupled to this voltage by a resistor 164.

In operation of the comparator system 140, the output signal $S_{out}$ (after it is distorted by the transmission path 36) causes the differential pair 148 to steer the current portion 152 to the capacitor 96. Potentials are thus generated in this capacitor which modify the reference signal $S_{ref}$ at the system port 88 so that it substantially tracks the signal distortion in the output signal $S_{out}$. A compensated reference signal $S_{cmp-ref}$ is thus generated and applied to the comparator input port 83. The time delay 99 of FIG. 4 can be realized with various delay components such as the capacitor 166 that parallels resistor 155.

The initial gain of the system 140 is a product of the gain of the voltage divider (transistors 154 and 155) and the parallel combination of resistors 92 and 164 when it is divided by the sum of resistors 160. The system has a time constant that is the product of the capacitor 96 and the sum of resistors 92 and 164. The current of the current source 144 is preferably large enough that cutoff of either transistor of the differential pair 148 is prevented for the greatest expected differential voltage applied to the pair. To reduce power consumption, the voltage divider (transistors 154 and 155) can be scaled to reduce this differential voltage and thus the size of the current source 144.

Figure 1:
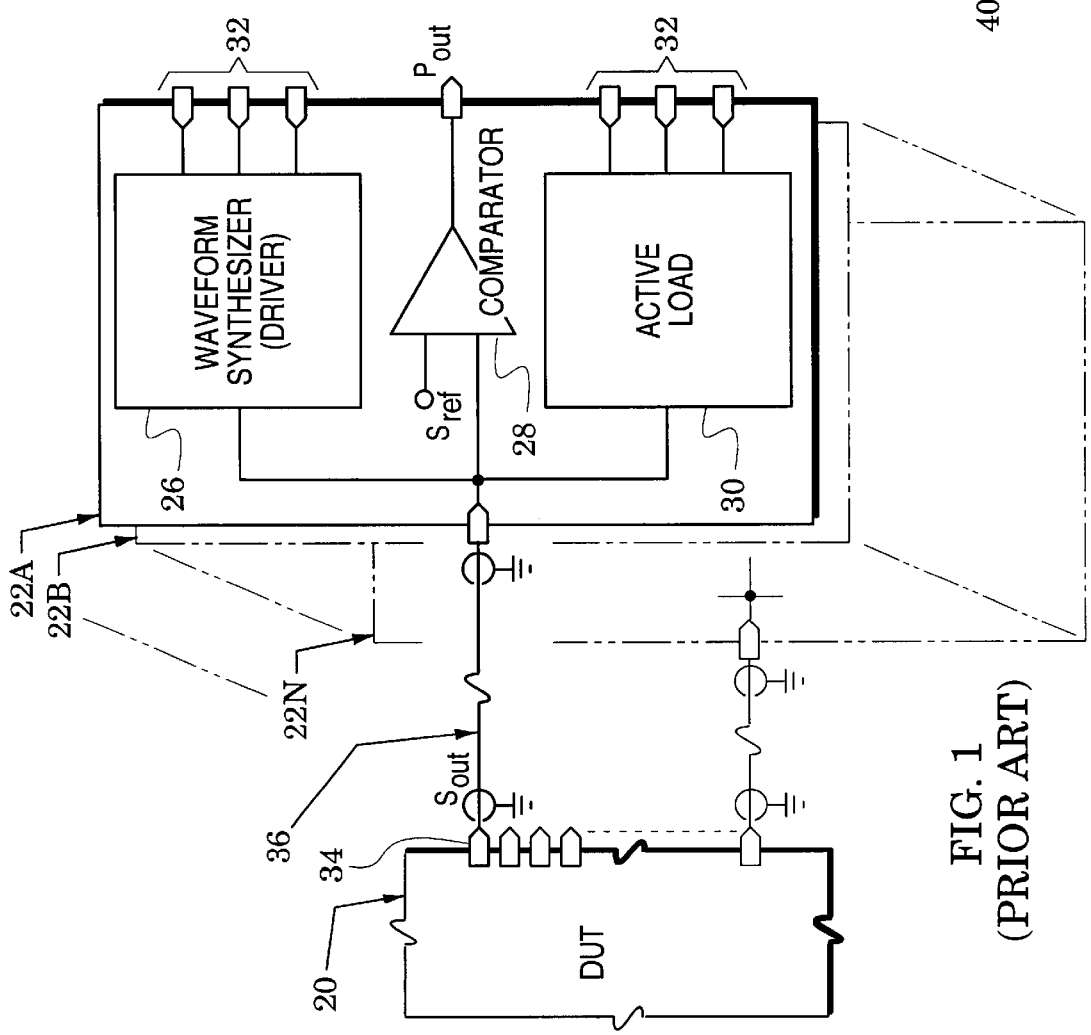
FIG. 1 is a shematic of a conventional test interface circuit which illustrates the circuit's use in testing a DUT.
Figure 8:
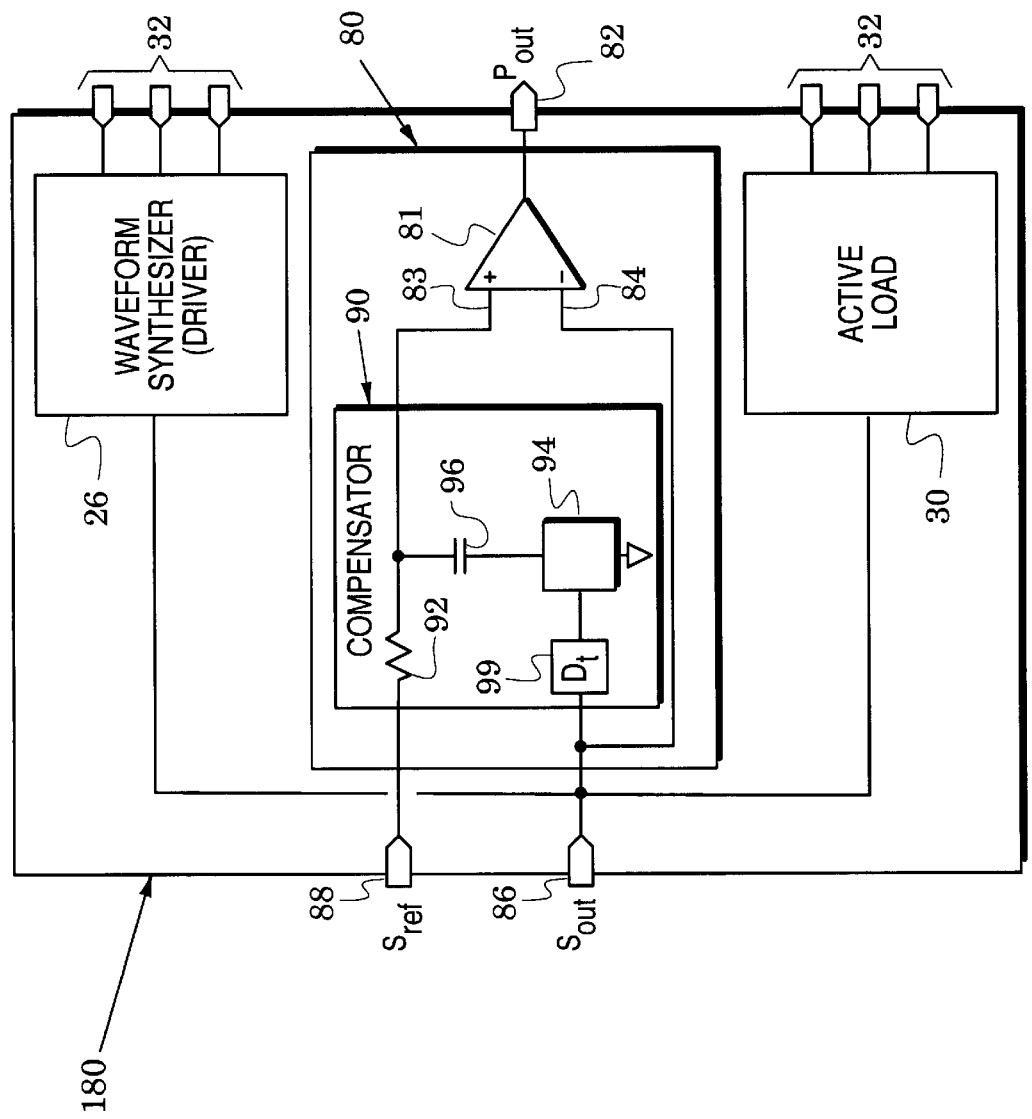
FIG. 8 is a schematic of a test interface module of the present invention that includes the comparator system of FIG. 4.

FIG. 8 illustrates a test interface module 180 which includes the driver 26 and active load 30 of FIG. 1 but which replaces the comparator 28 with a comparator system of the present invention (in particular, the comparator system 80 of FIG. 4). The test interface module 180 can therefore apply specified current loads and driver waveforms to a DUT that is attached to the system port 86. In addition, it can accurately compensate for distortion in the output signal $S_{out}$ that is imposed by a transmission path (e.g., the path 36 of FIG. 4) that provides the output signal $S_{out}$. Thus the reference signal $S_{ref}$ can be level shifted to accurately define the shape and timing of the output signal $S_{out}$.

Methods and structures of the invention compensate for signal distortion that is imposed by the transmission path (e.g., path 36 of FIG. 4) over which an output signal $S_{out}$ is received. Signal parameters of the output signal $S_{out}$ (e.g., voltage levels at respective test times $T_{tst}$) can then be accurately determined. The signal distortion has been exemplified as distortion at the upper edge of a signal step but may, in general, be any type of distortion that is imposed by a transmission path. In practicing the invention, this signal distortion may be estimated or may be measured with any of various conventional processes (e.g., with signal analyzers).

Although the invention has been described with exemplary bipolar junction transistors, the teachings of the invention can be practiced with any transistors in which a signal at a control terminal (e.g., a base) controls currents through current terminals (e.g., an emitter and a collector).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator system for comparing a device-under-test (DUT) signal $S_{dut}$ to a reference signal $S_{ref}$ and compensating for signal distortion that is imposed by a transmission path over which said DUT signal $S_{dut}$ is received, the system comprising:

a comparator that generates a comparator signal $S_{comp}$ in response to a difference between a signal at a first comparator input port and said DUT signal $S_{dut}$ at a second comparator input port;

an impedance member that couples said reference signal $S_{ref}$ to said first comparator input port;

a current generator that generates a distortion current in response to said DUT signal $S_{dut}$; and a capacitor that couples said distortion current to said first comparator input port;

said distortion current reacting with said capacitor and said impedance member to modify said reference signal $S_{ref}$ into a compensated reference signal $S_{cmp-ref}$ at said first comparator input port that substantially tracks said signal distortion.

2. The comparator system of claim 1, wherein said impedance member is a resistor.

3. The comparator system of claim 1, wherein said current generator includes:

a current source; and a differential amplifier that responds to said DUT signal $S_{dut}$ and is coupled between said current source and said capacitor.

4. The comparator system of claim 3, wherein said differential amplifier includes a differential pair of transistors.

5. The comparator system of claim 1, further including a delay element that couples said DUT signal $S_{dut}$ to said current generator and thereby delays said response of said current generator.

6. The comparator system of claim 5, wherein said delay element includes:

a resistive voltage divider that receives said DUT signal $S_{dut}$; and a delay capacitor that couples said resistive voltage divider to said current generator.

7. A test-interface module for testing a device-under-test (DUT) that generates a DUT signal $S_{dut}$ in response to at least one drive signal $S_{dr}$ wherein said DUT signal $S_{dut}$ is distorted by a signal distortion that is imposed by a transmission path over which said DUT signal $S_{dut}$ is received, the module comprising:

a driver that generates and couples said drive signal $S_{dr}$ to said DUT;

a current load that is coupled to said DUT; and a comparator system that includes:

a) a comparator that generates a comparator signal $S_{comp}$ in response to a difference between a signal at a first comparator input port and said DUT signal $S_{dut}$ at a second comparator input port;

b) a signal source that generates and level-shifts a reference signal $S_{ref}$;

c) an impedance member that couples said reference signal $S_{ref}$ to said first comparator input port;

d) a current generator that generates a distortion current in response to said DUT signal; and e) a capacitor that couples said distortion current to said first comparator input port;

said distortion current reacting with said capacitor and said impedance member to modify said reference signal $S_{ref}$ into a compensated reference signal $S_{cmp-ref}$ at said first comparator input port that substantially tracks said signal distortion.

8. The test-interface module of claim 7, wherein said impedance member is a resistor.

9. The test-interface module of claim 7, wherein said current generator includes:

a current source; and a differential amplifier that responds to said DUT signal $S_{dut}$ and is coupled between said current source and said capacitor.

10. The test-interface module of claim 9, wherein said differential amplifier includes a differential pair of transistors.

11. The test-interface module of claim 7, further including a delay element that couples said DUT signal $S_{dut}$ to said current generator and thereby delays said response of said current generator.

12. The test-interface module of claim 11, wherein said delay element includes:

a resistive voltage divider that receives said DUT signal $S_{dut}$; and a delay capacitor that couples said resistive voltage divider to said current generator.

13. A comparator system for comparing a device-under-test (DUT) signal $S_{dut}$ to a reference signal $S_{ref}$ and compensating for signal distortion that is imposed by a transmission path over which said DUT signal $S_{dut}$ is received, the system comprising:

a comparator that generates a comparator signal $S_{comp}$ in response to a difference between a signal at a first comparator input port and said DUT signal $S_{dut}$ at a second comparator input port;

a resistor that couples said reference signal $S_{ref}$ to said first comparator input port;

a capacitor coupled to said first comparator input port;

a current source; and a differential pair of transistors that steer a distortion current from said current source to said capacitor in response to said DUT signal $S_{dut}$;

said distortion current reacting with said capacitor and said impedance member to modify said reference signal $S_{ref}$ into a compensated reference signal $S_{cmp-ref}$ at said first comparator input port that substantially tracks said signal distortion.

14. The comparator system of claim 7, further including a delay element that couples said DUT signal $S_{dut}$ to said current generator and thereby delays said response of said current generator.

15. The comparator system of claim 8, wherein said delay element includes:

a resistive voltage divider that receives said DUT signal $S_{dut}$; and a delay capacitor that couples said resistive voltage divider to said current generator.

16. The comparator system of claim 12 wherein said transistors are bipolar junction transistors.

* * * * *